US 6,727,524 B2

(12) United States Patent
Kurtz

(10) Patent No.: US 6,727,524 B2
(45) Date of Patent: Apr. 27, 2004

(54) P-N JUNCTION STRUCTURE

(75) Inventor: Anthony D. Kurtz, Ridgewood, NJ (US)

(73) Assignee: Kulite Semiconductor Products, Inc., Leonia, NJ (US)

(*) Notice: Subject to any disclaimer, the term of this patent is extended or adjusted under 35 U.S.C. 154(b) by 0 days.

(21) Appl. No.: 10/104,568

(22) Filed: Mar. 22, 2002

(65) Prior Publication Data
US 2003/0178704 A1 Sep. 25, 2003

(51) Int. Cl.[7] ............................................... H01L 29/22
(52) U.S. Cl. ...................... 257/104; 257/106; 257/603; 257/625; 257/628
(58) Field of Search ................................ 257/627–628, 257/104–106, 109, 380, 603, 625; 438/380, 983

(56) References Cited

U.S. PATENT DOCUMENTS

| 3,654,579 | A | * | 4/1972 | Kurtz et al. | |
| 3,858,096 | A | * | 12/1974 | Kuhrt et al. | 257/746 |
| 3,872,490 | A | * | 3/1975 | Higashi et al. | 257/415 |
| 3,905,037 | A | * | 9/1975 | Bean et al. | 257/506 |
| 4,349,394 | A | * | 9/1982 | Wei | 438/476 |
| 4,443,293 | A | * | 4/1984 | Mallon et al. | |
| 4,738,935 | A | * | 4/1988 | Shimbo et al. | 438/455 |
| 4,739,298 | A | * | 4/1988 | Kurtz et al. | 338/2 |
| 4,785,457 | A | * | 11/1988 | Asbeck et al. | |
| 5,040,032 | A | * | 8/1991 | Kapon | |
| 5,286,671 | A | | 2/1994 | Kurtz et al. | 437/64 |
| 5,405,786 | A | * | 4/1995 | Kurtz | 438/53 |
| 5,427,977 | A | * | 6/1995 | Yamada et al. | |
| 5,442,199 | A | * | 8/1995 | Saito et al. | |
| 5,574,296 | A | * | 11/1996 | Park et al. | 257/103 |
| 5,604,144 | A | * | 2/1997 | Kurtz | |
| 5,783,845 | A | * | 7/1998 | Kondo et al. | |
| 5,804,090 | A | * | 9/1998 | Iwasaki et al. | 216/99 |
| 6,045,626 | A | * | 4/2000 | Yano et al. | 148/33.4 |
| 6,306,729 | B1 | * | 10/2001 | Sakaguchi et al. | |
| 6,365,951 | B1 | * | 4/2002 | Worley | |
| 2003/0015719 | A1 | * | 1/2003 | Haga | 257/82 |

OTHER PUBLICATIONS

"Physical Acoustics—Principles and Method", Warren P. Mason, editor, published by Academic Press (1964), Chapter 12 entitled, "Use of p–n Junction Semiconductor Transducers in Pressure and Strain Measurements", pp. 237 through 319 by M.E. Sikorski of the Bell Telephone Laboratories.

* cited by examiner

Primary Examiner—Long Pham
Assistant Examiner—Thao X. Le
(74) Attorney, Agent, or Firm—Duane Morris LLP

(57) ABSTRACT

There is disclosed a p-n junction diode structure whose electrical characteristics can be affected by the application of pressure or other mechanical stresses that will control sensitivity. The p-n junction consists of two different semiconductor materials, one being of p-type and the other of n-type, both having predetermined crystallographic axes which are fusion bonded together to form a p-n junction. Because of the ability to control the position of the crystallographic axes with respect to one another, one can affect the electrical characteristics of the p-n junction and thereby produce devices with improved operating capabilities such as Zener diodes, tunnel diodes as well as other diodes.

14 Claims, 2 Drawing Sheets

P-N JUNCTION STRUCTURE

FIELD OF INVENTION

This invention relates to p-n junction structures, and more particularly, to a p-n junction structure whose electrical characteristics are affected by the application of pressure or other mechanical stresses.

BACKGROUND OF THE INVENTION

The p-n junction, such as diodes and transistors are found in a widespread of applications, including structures which are affected by pressure or mechanical stresses. These devices have found a multitude of applications in the field of electronics ranging from the rectification of signals to the amplification of signals. The devices have also been used to convert one form of energy into another as, for example, the case of a solar cell where light is converted into electrical energy. New applications are continuously being found for p-n junction devices, which include the conversion of mechanical or acoustic signals into electrical signals. P-n junctions have particular applicability in the field of pressure and strain transducers because they have the advantage of static property measurement, their sensitivity is competitive with that of other signal devices, and they are inherently small in size and simple in construction.

The devices are well known. See for example the text entitled, "Physical Acoustics—Principles and Method", Warren P. Mason, editor, published by Academic Press (1964), Chapter 12 entitled, "Use of p-n Junction Semiconductor Transducers in Pressure and Strain Measurements", pages 237 through 319 by M. E. Sikorski of the Bell Telephone Laboratories. Basically, this chapter discusses the use of semiconductor diodes in many different applications including strain gages, microphones and other devices as well. It is well known that in a multi-valley semiconductor such as silicon, the effective mass varies with direction being greater in some directions than others, the shape of the energy-momentum surface is an ellipsoid rather than a sphere. The effective mass m* is given by $$m^* = \frac{1}{\frac{d^2E}{dp^2}}$$

where E is the energy and p the momentum. For n type silicon, for instance, the mobility ($\mu$), which is directly proportional to the effective mass, is much greater in the direction normal to the longitudinal direction of the ellipsoid and much smaller in the direction along the longitudinal axis. See FIG. 3, for example, showing a form of the energy surface which is plotted against the wave vector for silicon along the [100] axes. As one can see, the above-noted equation is also shown in FIG. 3.

In any event, for n-type silicon there are three sets of ellipsoids located on the three axes <100> in energy momentum space. Reference is made to FIG. 4, where there is shown a multi-valley structure for n-type silicon in momentum space. As one can ascertain, there are three ellipsoids in energy momentum space and these are in the so-called <100> axes. These ellipsoids are shown as 30, 31 and 32. The application of certain stresses will move some electrons from one ellipsoid to another, creating either more or fewer low effective mass electrons. If more low effective mass electrons result from the application of an external pressure or stress, the resistivity will decrease.

Similarly, for p-silicon, there are also three such ellipsoids that are situated along the various <111> axes. In this case however, a tensile stress in the <111> direction produces more heavy holes, thus increasing the resistivity. When one considers the p-n junction under mechanical stress, the effect of the change in the number of light and heavy carriers become very significant, particularly since current flow across the junction results from both holes and electrons.

It is also well known that the application of the stress can change the energy gap of a semiconductor, the resulting change depending upon the magnitude of the stress, as well as the direction with respect to the crystal orientation. This is true for both homogeneous, as well as porous structures, although in porous structure, this effect may be enhanced by Quantum Confinement. Moreover, since in a Zener diode or a tunnel diode, the junction current which also depends on effective mass will be changed. For the Zener diode, the reverse current will increase and the breakdown voltage will decrease, if the number of low effective mass carriers is increased. Similarly, for a tunnel diode, a greater number of low effective mass carriers will increase the current in the forward direction.

For a p-n Zener diode in the reverse direction, the current flow results mainly from the minority carriers in the less highly doped section of the structure. Thus, its crystallographic orientation with respect to any stress field is of paramount importance. Similarly, for a tunnel diode it is important to consider the crystallographic orientation of the structure causing majority carrier flow.

In any event, based on such considerations, it has been determined that by utilizing a p-structure and an n-structure, which are bonded together and which structures have a crystallographic orientation in different directions or in different orientations, one can achieve a diode structure which operates with improved efficiency over those of the prior art.

SUMMARY OF INVENTION

There is disclosed a p-n junction diode structure whose electrical characteristics can be affected by the application of pressure or other mechanical stresses that will control sensitivity. The p-n junction consists of two different semiconductor materials, one being of p-type and the other of n-type, both having predetermined crystallographic axes which are fusion bonded together to form a p-n junction. Because of the ability to control the position of the crystallographic axes with respect to one another, one can affect the electrical characteristics of the p-n junction and thereby produce devices with improved operating capabilities such as Zener diodes, tunnel diodes as well as other diodes.

DETAILED DESCRIPTION OF THE FIGURES

Figure 1:
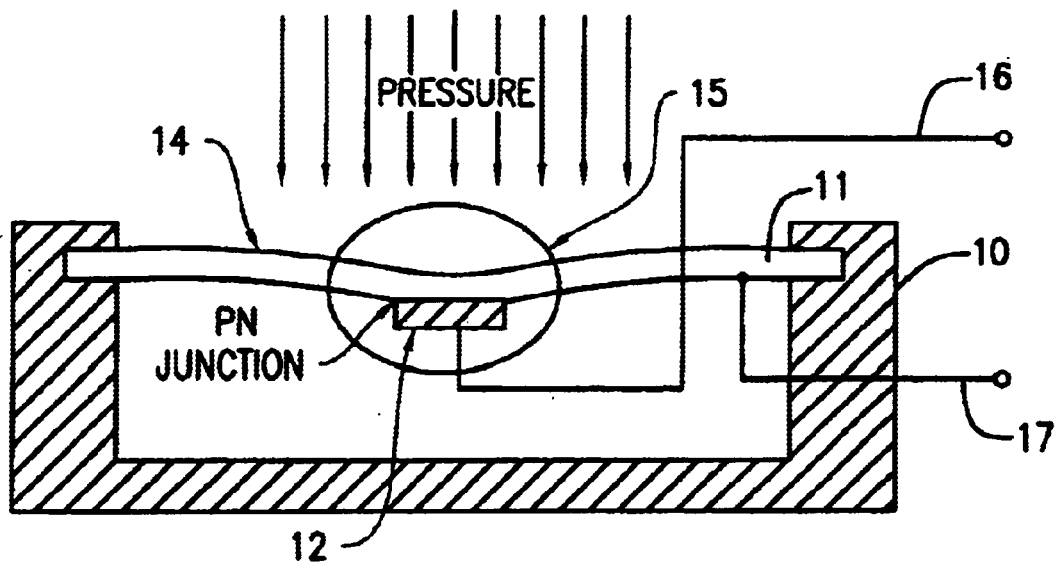
FIG. 1 is a diagrammatic view of a p-n junction transducer according to this invention.

Referring to FIG. 1, there basically is shown a member 14, which is supported on a base member or structure 10. The base 10 may be an insulator such as glass or other material. The base has a central aperture and may be circular or square. The member 14 covers the aperture and can deflect upon application of a force or pressure to the surface. The member 14 is an n-type semiconductor wafer, which has a predetermined oriented crystalline axis. There is bonded by means of a fusion bond to the n-type semiconductor 14 a p-type semiconductor 12. The p-type semiconductor 12 is bonded by means of a fusion bonding technique to the n-type semiconductor 14. As one can see, there is a lead 16 associated with the p-type semiconductor and a lead 17 associated with the n-type semiconductor. The leads are coupled to terminals defining the anode and cathode (PN) of the diode and therefore a bias voltage can be applied to the leads. As one can see, a pressure is applied to this device and the device normally behaves as a pressure transducer.

Such devices as for example, microphones, have been made by attaching a tunnel diode wafer to a metallic diaphragm. An alternate method is to diffuse or epitaxially grow different conductivity type materials on a single crystal diaphragm. This configuration is shown in the above-noted text and described on page 297.

According to the present invention, the n-type semicondutor 14 is fusion bonded to the p-type semiconductor 12 to create a p-n junction 20 at the fusion bonded region. The crystallographic axis of the p and n materials have different orientations, whether each region is porous or not. In the structure shown, p-type region 12 may be porous and the n-type semiconductor is non-porous. When a fusion bond is made, the junction becomes non-porous. It is known that one can obtain alignment of the crystal axis in porous semiconductors as well as in non-porous. Because of the different crystallographic orientation, one obtains a structure where the optimum crystalline directions are selected to enhance either avalanche breakdown or tunneling. This is accomplished by assuring that the application of a given stress creates the greatest change in the number of the light and heavy charge carriers, as well as the greatest change in the band gap edges.

Figure 2:
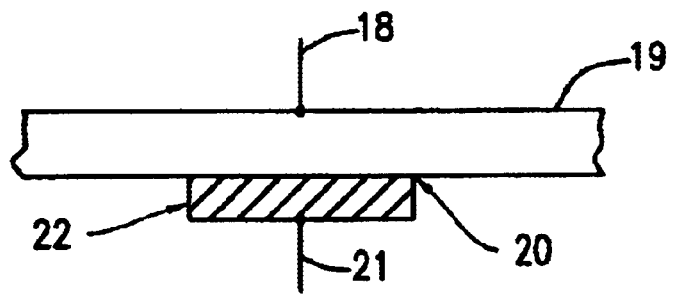
FIG. 2 is an enlarged view of the p-n junction according to this invention.
Figure 3:
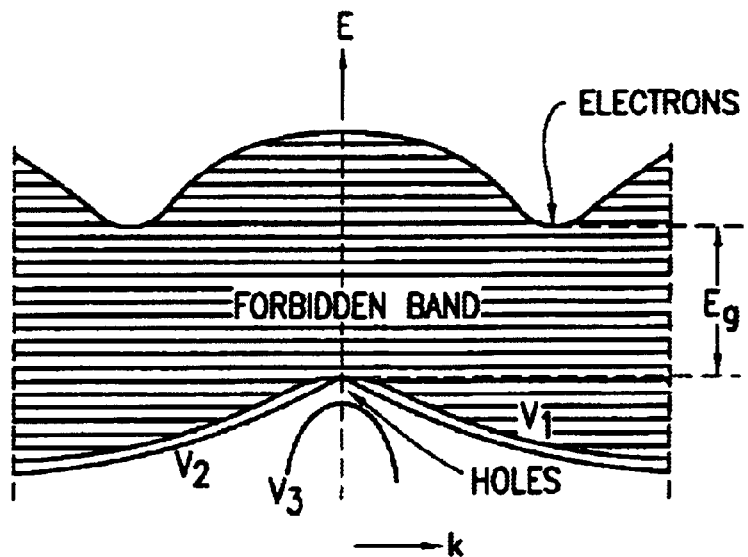
FIG. 3 is a plot showing a form of the energy surfaces plotted against wave vector for silicon along the [100] axes.
Figure 4:
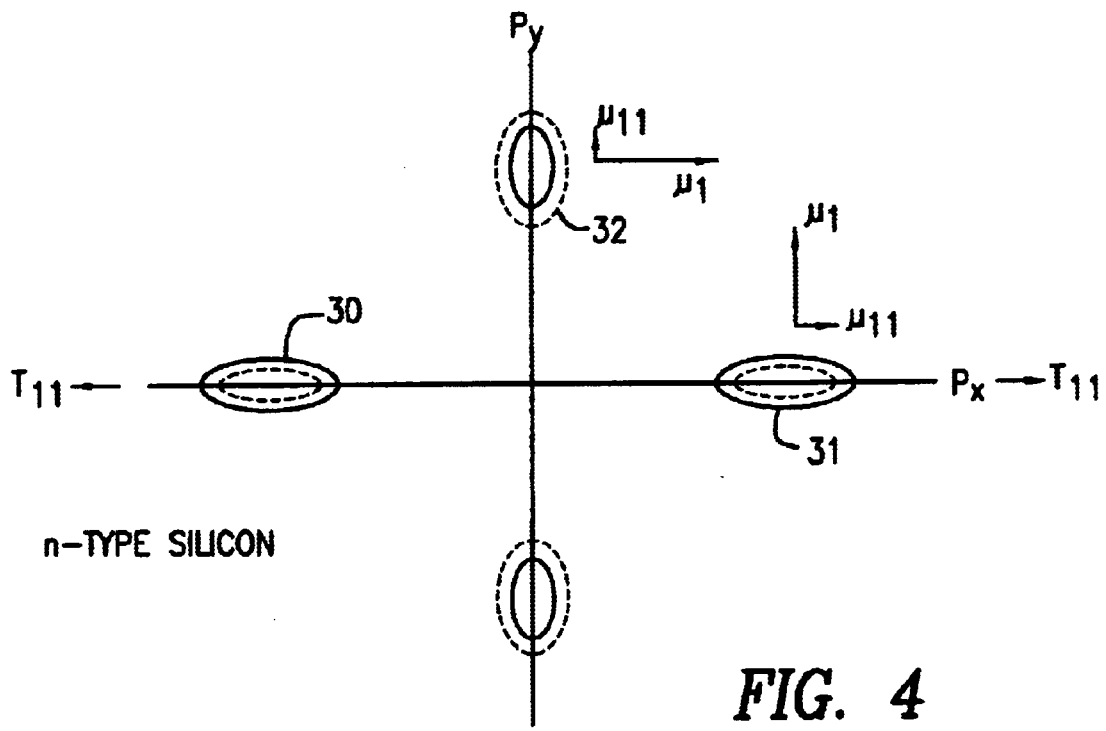
FIG. 4 is a plot of the multi-valley structure for n-type silicon in momentum space.

Referring to FIG. 2, there is shown an enlarged version of the p-n junction or structure 15 of FIG. 1. As seen, the n-type semiconductor is represented by numeral 19, while the p-type semiconductor is depicted by numeral 22. The junction is shown by reference numeral 20, while the contacts are shown by reference numerals 18 and 21. In any event, the p-type material 22 is p-type silicon specifically selected and oriented at a particular axis such as the <111> axis. The material has a specifically selected doping level, which is greater than $10^{19}$. The n-type material 19 is silicon which crystallographic axis is, for example, at the <100> axis and also has a specific selected doping level greater than $10^{19}$. The doped p-type material is fusion bonded to the n-type material. The fusion bonding technique allows a molecular bond between the p and n type silicon materials to form a p-n junction 20. It is important to use fusion bonding so that there is a molecular bond between the p-type 22 and n-type silicon 19, which creates a p-n junction 20. For the Zener diode, the device shown in FIG. 2 is reverse biased and the doping is much higher for both the n and the p silicon materials. For an Esaki or tunnel diode, the device is biased and the doping levels are even higher for both the n and the p types. In any event, doping levels for Esaki and for Zener diodes are well known. Reference can be made to the above-noted text.

It is a main objective of the present invention to fusion bond p or n-type silicon together while assuring that the crystallographic axes are differently oriented to provide a p-n junction where the orientation of the axes will enhance the avalanche or the tunnel effect. The application of a given stress will create a great change in a number of light and heavy carriers, as well as the greatest change in the band gap edges and further due to the crystallographic orientation.

Thus, as shown in FIG. 1 the diode structure, when pressure is applied, will have an enhanced tunneling or avalanche effect. The conductivity of the device will greatly increase for an applied pressure and one would have a very sensitive transducer or microphone. Fusion bonding has been utilized in the prior art and is a well known technique of bonding silicon wafers to silicon wafers. Basically, see U.S. Pat. No. 5,286,671 entitled, "Fusion Bonding Techniques for Use of Fabricating Semiconductor Devices" issued on Feb. 15, 1994 to Anthony D. Kurtz et al., the inventor herein and is assigned to Kulite Semiconductor Products, Inc., the assignee herein. As one can ascertain, wafers of silicon can be bonded by contact to other wafers at elevated temperatures for given time intervals. In this way, two wafers can be contacted together and provide a full strength seal by bonding the wafers at temperatures at or below a 1000° C. for times of 5 to 10 minutes. Based on fusion bonding, molecules will diffuse from one wafer to the other wafer, thus forming a junction and a bond. In any event, the fusion bonding permits a structure where both wafers have different crystallographic orientations and therefore such orientations aid in the performance of diodes, such as tunnel diodes or Zener diodes, as indicated above.

What is claimed is:

1. A semiconductor diode, comprising:
   a p-type semiconductor material having a defined crystallographic axis orientation fusion bonded to an n-type semiconductor material having a second crystallographic axis orientation larger in area than said p-type material, said fusion bonding creating a molecular bonded p-n junction between said p-type material and said n-type material, said p-n junction having a p-region crystallographic axis orientation different than that of said n-region selected to enhance carrier transfer.

2. The diode according to claim 1, wherein said diode is a Zener diode.

3. The diode according to claim 1, wherein said diode is a tunnel diode.

4. The diode according to claim 1, wherein said p and n regions are doped to levels greater than $10^{19}$.

5. The diode according to claim 1, wherein said crystallographic axis orientation of said p-type semiconductor is <111>.

6. The diode according to claim 1, wherein said crystallographic axis orientation of said n-type semiconductor is <100>.

7. The diode according to claim 1, further comprising:
   a housing having a central aperture with said material bonded to the housing to cover said aperture to enable said material to deflect upon application of a pressure thereto.

8. The diode according to claim 1, wherein said crystallographic axes are chosen and are oriented to enhance avalanche breakdown.

9. The diode according to claim 1, wherein said crystallographic axes are chosen and are oriented to enhance tunneling.

10. The diode according to claim 1, further including:
    a first terminal connected to said p-region,
    a second terminal connected to said n-region
    said first and second terminals adapted to receive a bias potential.

11. The diode according to claim 1, wherein said p-region is a porous semiconductor.

12. The diode according to claim 11, wherein said n-region is a non-porous semiconductor.

13. A semiconductor diode, comprising:

a p-type semiconductor material having a defined crystallographic axis orientation, an n-type semiconductor material having a second crystallographic axis orientation, said n-type semiconductor material larger in area than said p-type material, a p-n junction between said p-type material and said n-type material, said p-n junction having a p-region crystallographic axis orientation different than that of said n-region, wherein said junction is formed by fusion bonding said p-type material to said n-type material, and a housing having a central aperture with said n-type material bonded to the housing to cover said aperture to enable said n-type material to deflect upon application of a pressure thereto.

14. The diode according to claim 13, further including:

a first terminal connected to said p-region, a second terminal connected to said n-region said first and second terminals adapted to receive a bias potential.

* * * * *